(12) United States Patent
Tsai

(10) Patent No.: US 8,191,842 B2
(45) Date of Patent: Jun. 5, 2012

(54) FIXING MODULE

(75) Inventor: Wen-Cheng Tsai, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 324 days.

(21) Appl. No.: 12/414,678

(22) Filed: Mar. 31, 2009

(65) Prior Publication Data
US 2009/0294611 A1 Dec. 3, 2009

(30) Foreign Application Priority Data

May 30, 2008 (TW) .............................. 97120273 A

(51) Int. Cl.
- A47B 96/00 (2006.01)
- A47K 1/00 (2006.01)
- A47K 5/00 (2006.01)
- E04G 5/06 (2006.01)
- F16L 3/08 (2006.01)

(52) U.S. Cl. ......... 248/222.12; 248/220.21; 248/222.13; 248/222.11; 361/679.02; 361/679.32; 361/679.39; 361/679.37

(58) Field of Classification Search ............. 361/679.39, 361/679.37, 679.33, 679.32, 679.31, 679.01, 361/679.44, 727, 679.35; 248/222.12, 222.13, 248/223.41, 225.11
See application file for complete search history.

(56) References Cited

U.S. PATENT DOCUMENTS

| | | | | |
|---|---|---|---|---|
| 5,262,923 A * | 11/1993 | Batta et al. | ............... | 361/679.37 |
| 5,734,557 A * | 3/1998 | McAnally et al. | ............ | 361/727 |
| 6,373,707 B1 * | 4/2002 | Hutchins | ....................... | 361/725 |
| 6,396,686 B1 * | 5/2002 | Liu et al. | .................. | 361/679.33 |
| 6,771,496 B1 * | 8/2004 | Wu | .......................... | 361/679.58 |
| 6,999,309 B2 * | 2/2006 | Hsu | .......................... | 361/679.38 |
| 7,327,565 B2 * | 2/2008 | Chen et al. | ............... | 361/679.33 |
| 7,656,654 B2 * | 2/2010 | Liu et al. | .................. | 361/679.33 |
| 7,841,565 B2 * | 11/2010 | Peng et al. | ................... | 248/27.1 |
| 2006/0034048 A1 * | 2/2006 | Xu | ............................... | 361/685 |
| 2006/0231686 A1 * | 10/2006 | Lin | ............................. | 248/27.1 |
| 2009/0091882 A1 * | 4/2009 | Liu et al. | .................. | 361/679.33 |

FOREIGN PATENT DOCUMENTS

CN 2673041 1/2005

\* cited by examiner

*Primary Examiner* — Amy J Sterling

(74) *Attorney, Agent, or Firm* — Jianq Chyun IP Office

(57) ABSTRACT

A fixing module and a case having the fixing module are provided. The case includes a plate having at least one first mounting hole, and a fixing module. The fixing module is used to fix an electronic device to the plate. The electronic device has at least one second mounting hole corresponding to the first mounting hole. The fixing module includes a base, a sliding member, and at least one resilient element. The base is mounted to the plate. The sliding member is movably disposed on the base. The resilient element located between the base and sliding member includes at least one pressing portion and at least one locking pin located on the pressing portion. When the sliding member is in a locking position, the sliding member presses the pressing portion such that the locking pin passes through the first mounting hole and inserts into the second mounting hole.

13 Claims, 5 Drawing Sheets

FIXING MODULE

CROSS-REFERENCE TO RELATED APPLICATION

This application claims the priority benefit of Taiwan application serial no. 97120273, filed on May 30, 2008. The entirety of the above-mentioned patent application is hereby incorporated by reference herein and made a part of specification.

BACKGROUND OF THE INVENTION

1. Field of the Invention

The present invention generally relates to a fixing module and a case having the fixing module, and particularly, to a tool-less fixing module and a case having such a tool-less fixing module.

2. Description of Related Art

In the information and multimedia era nowadays, various electronic devices, such as, desk-top personal computers and digital versatile disc players (DVD players) are being widely used. Electronic devices that can read data, such as, an optical disc drive (ODD), a hard disc drive (HDD), and a floppy disc drive, are embedded in these electronic devices.

In general, to mount these electronic devices to the electronic equipment, a fastening tool such as a screw driver is usually used to fasten a screw between the electronic device and a case of the electronic equipment. However, when the fastening tool is used to fasten the screw between the electronic device and the case of the electronic device, an operator needs to align the screws with the mounting holes of the electronic device and the case so as to fasten the electronic device to the case, which is time-consuming. As such, the efficiency of assembly is low.

In addition, when it is desired to remove the electronic device from the electronic equipment, the screws must be removed before the electronic device being removed from the case. Likewise, to re-assemble the electronic device to the case of the electronic equipment, the screws are fastened again to fasten the electronic device to the case of the electronic equipment. Therefore, the assembly of the electronic device with screws is inconvenient to the user.

SUMMARY OF THE INVENTION

Accordingly, the present invention is directed to a fixing module that can be used to fix an electronic device to a case without using a tool.

The present invention is also directed to a case that enables a user to fix an electronic device into the case without using a tool.

The present invention provides a fixing module for fixing an electronic device to a plate. The plate has at least one first mounting hole, and the electronic device has at least one second mounting hole corresponding to the first mounting hole. The fixing module includes a base, a sliding member, and at least one resilient element. The base is configured to be mounted to the plate. The sliding member is movably disposed on the base. The resilient element located between the base and the sliding member includes at least one pressing portion and at least one locking pin located on the pressing portion. When the sliding member is in a locking position, the sliding member presses the pressing portion such that the locking pin passes through the first mounting hole and inserts into the second mounting hole.

According to one embodiment of the present invention, the base has at least one opening for exposing the first mounting hole, and the locking pin is configured to pass through the opening.

According to one embodiment of the present invention, the base includes at least one first restricting structure located on a first surface of the base that faces the resilient element, the resilient element includes at least one second restricting structure corresponding to the first restricting structure, and the first restricting structure is engaged with the second restricting structure. The first restricting structure may be a protrusion and the second restricting structure may be an opening or a slot.

According to one embodiment of the present invention, each end of the base includes a third restricting structure and a fourth restricting structure respectively, for restricting movement of the sliding member between the locking position and an unlocking position. The third restricting structure may be a hook, and the fourth restricting structure may be a protrusion.

According to one embodiment of the present invention, the base further includes a plurality of fifth restricting structures, the plate further includes a plurality of sixth restricting structures corresponding to the fifth restricting structures, and the fifth restricting structures are configured for engaging with the sixth restricting structures.

According to one embodiment of the present invention, the base includes a second surface facing the plate, and a third surface and a fourth surface perpendicularly connected to the second surface, and the third surface and the fourth surface are provided with the fifth restricting structures. The fifth restricting structures may be protrusions, and the sixth restricting structures may form a sliding rail.

According to one embodiment of the present invention, the pressing portion of the resilient element further includes a bump, the sliding member includes a cavity corresponding to the bump, and the bump is engaged in the cavity when the sliding member is in the locking position.

According to one embodiment of the present invention, the sliding member includes a pushing portion for user to manipulate.

According to one embodiment of the present invention, the sliding member includes an inclined guiding surface configured to press the resilient element.

According to one embodiment of the present invention, a fifth surface of the sliding member away from the resilient element is provided with a plurality of identification marks for indicating movement direction of the sliding member.

The present invention further provides a case for receiving an electronic device. The case includes a first plate and a fixing module. The first plate includes at least one first mounting hole, and the fixing module may be a fixing module according to any one of the above embodiments.

According to one embodiment, the first plate further includes a plurality of seventh restricting structures located on two sides of the base for restricting movement of the base.

According to one embodiment, the case further includes a plurality of second plates assembled to form a container. The first plate is mounted to the second plates and within the container.

The fixing module of the present invention can facilitate assembly and removal of the electronic device without using any tools. Therefore, the fixing module and the case having the fixing module of the present invention are convenient to use.

In order to make the aforementioned and other features and advantages of the present invention more comprehensible, embodiments accompanied with figures are described in detail below.

DESCRIPTION OF THE EMBODIMENTS

Figure 1:
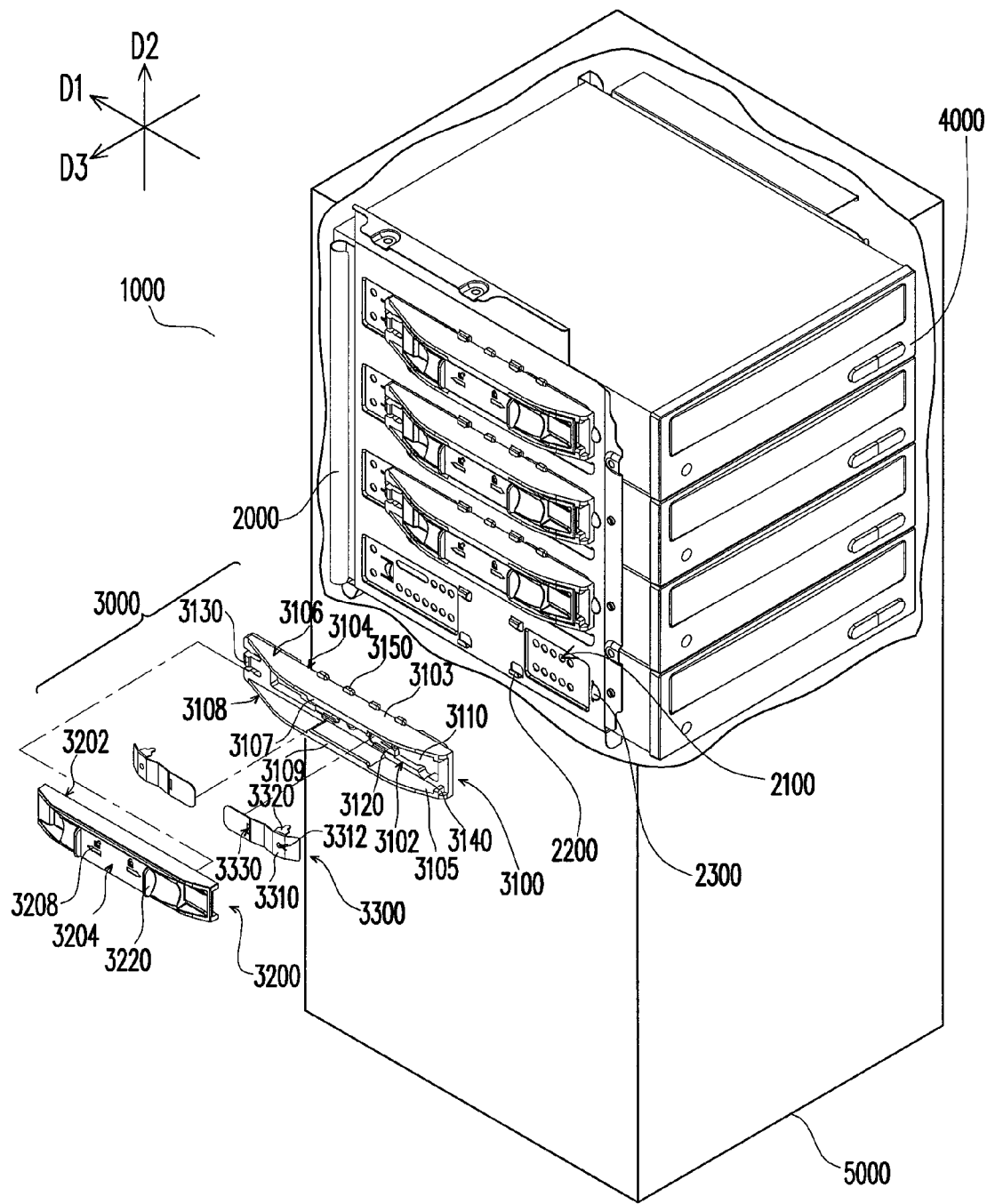
FIG. 1 illustrates is a case and a plurality of electronic devices mounted to the case according to one embodiment of the present invention, with a part of fixing modules separated from a plate of the case.
Figure 2:
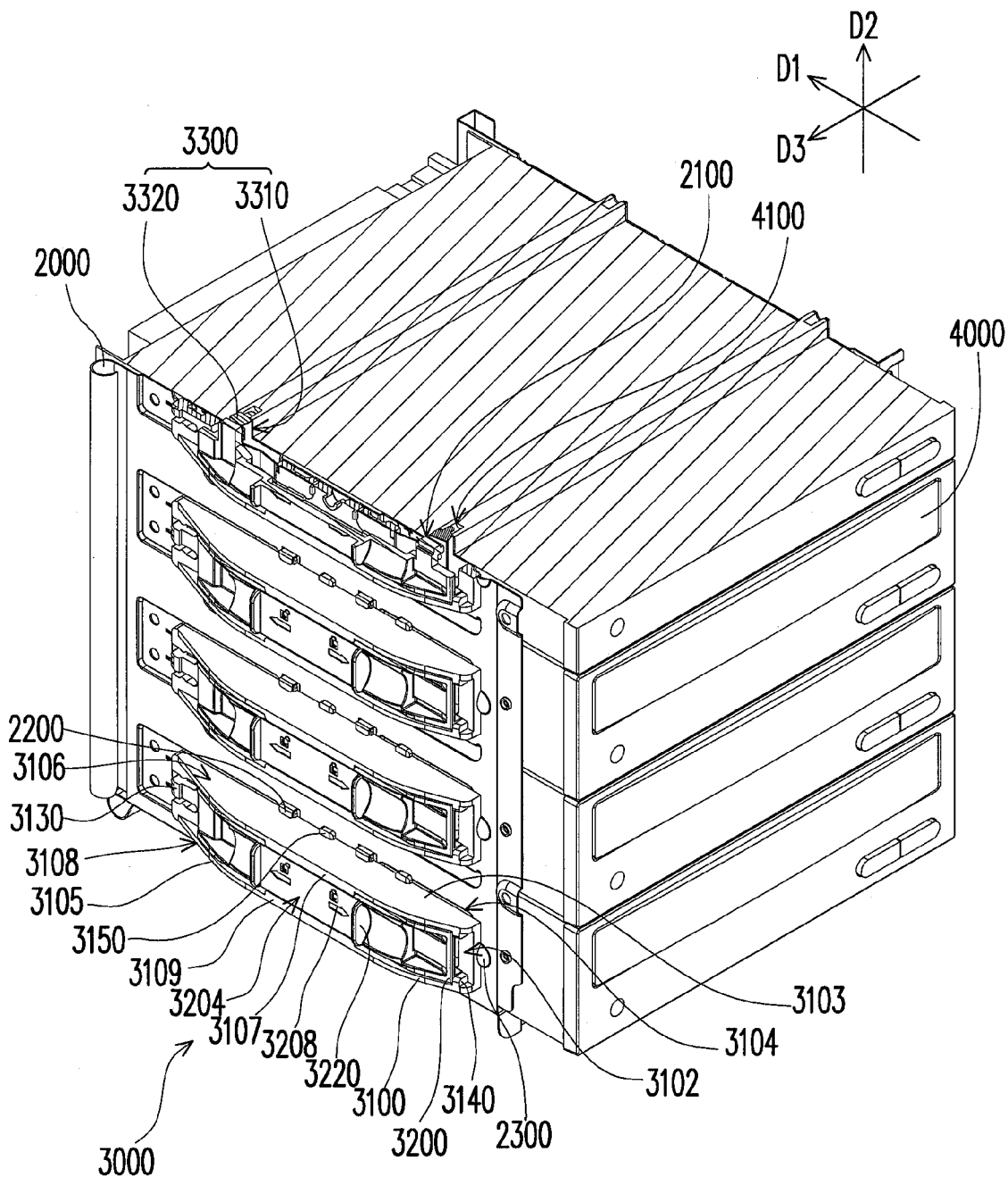
FIG. 2 is a cross-sectional view of the electronic devices and the case of FIG. 1.

FIG. 1 illustrates is a case and a plurality of electronic devices mounted to the case according to one embodiment of the present invention, with a part of the fixing modules separated from a plate of the case. FIG. 2 is across-sectional view of the electronic devices and the case of FIG. 1. The case 1000 of FIG. 1 and FIG. 2 is illustrated as a case of a host of a desk-top personal computer, and the electronic devices 4000 are illustrated as optical disk drives. The case 1000 of the present embodiment may also be a case of a DVD player or other suitable electronic device, and the electronic device 4000 may also be a hard disk drive, a floppy disk drive or another suitable electronic device.

Referring to FIG. 1 and FIG. 2, the case 1000 is configured to receive the electronic device 4000. The case 1000 includes a first plate 2000 and a fixing module 3000 disposed on the first plate 2000. The first plate 2000 defines at least one first mounting hole 2100, and each electronic device 4000 has at least one second mounting hole 4100 corresponding to the first mounting hole 2100. The fixing module 3000 is used to fix the electronic device 4000 to the first plate 2000. In addition, the case 1000 further includes a plurality of second plates 5000 assembled to form a container 5000, and the first plate 2000 is mounted to the second plate 500 and within the container 5000. The container 5000, for example, defines openings allowing the electronic devices 4000 to be mounted into the container 5000. When the electronic device 4000 is mounted in the container 5000, the container 5000 exposes a portion of the electronic device 4000.

Figure 3:
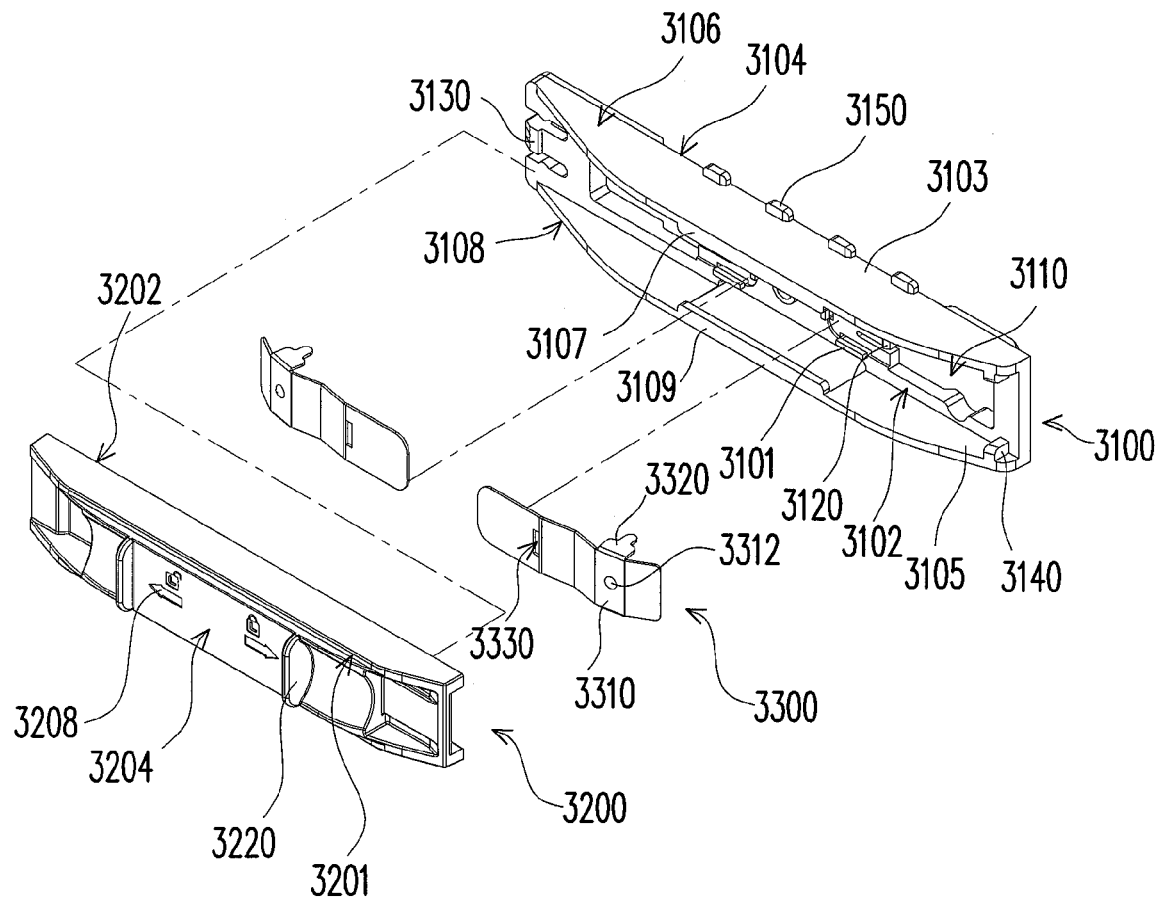
FIG. 3 is an enlarged and exploded view of the fixing module of FIG. 2.

FIG. 3 is an enlarged and exploded view of the fixing module of FIG. 2. Referring to FIG. 2 and FIG. 3, the fixing module 3000 includes a base 3100, a sliding member 3200, and at least one resilient element 3300, such as, a metal resilient strip. The base 3100 is disposed on the first plate 2000, and the sliding member 3200 is movably disposed on the base 3100. The resilient element 3300 disposed between the base 3100 and the sliding member 3200 includes at least one pressing portion 3310 and at least one locking pin 3320 formed on the pressing portion 3310. When the sliding member 3200 is in a locking position, the sliding member 3200 presses the pressing portion 3310 such that the locking pin 3320 passes through the first mounting hole 2100 and inserts into the second mounting hole 4100. Tools and screws are not required when the case 1000 and the fixing module 3000 of the present invention are used, and the electronic device 400 is quickly removed from the first plate 2000 of the case 1000. It is convenient for the user to use.

Various modifications made to the case 1000 of the present embodiment are described below. It should be understood that these modifications should not be used to limit the scope of the present invention. The base 3100 includes, for example, at least one opening 3110 corresponding to the first mounting hole 2100. The locking pin 3320 of the resilient element 3300 passes through the opening 3110. In addition, the base 3100 includes at least one first restricting structure 3120. The first restricting structure 3120 is disposed on a first surface 3102 of the base 3100 that faces the resilient element 3300. Correspondingly, the resilient element 3300 includes a second restricting structure 3330 positioned corresponding to the first restricting structure 3120. The resilient element 3300 can be securely mounted to the base 3100 through the engagement of the first restricting structure 3120 with the second restricting structure 3330. In the present embodiment, the first restricting structure 3120 may be a protrusion, and the second restricting structure 3330 may be an opening or a slot shaped and sized corresponding to the first restricting structure 3120. However, it is noted that the protrusion/opening of the first and second restricting structures are only illustrative and should not be used to limit the scope of the present invention. The first restricting structure 3120 and the second restricting structure 3330 can both be properly varied in shape and size as long as they are complementary in shape and fit with each other in size.

Besides, the material of the base 3100 can be plastic, metal or another suitable material according to needs. The base 3100 made from plastic is advantageous in light weight, which satisfies the needs of light and low profile of the electronic devices. Though relatively heavy, the base 3100 made of metal is durable thus having a relative longer lifespan.

Moreover, a third restricting structure 3130 is formed on one end of the base 3100, and a fourth restricting structure 3140 is formed on the other end of the base 3100. The third restricting structure 3130 and the fourth restricting structure 3140 are used to limit the displacement of the sliding member 3100. In the present embodiment, the third restricting structure 3130 is a hook, and the fourth restricting structure 3140 is a protrusion. However, it is noted that the hook/protrusion of the third restricting structure and second restricting structure are only illustrative and should not be used to limit the scope of the present invention.

The base 3100 of the present embodiment can be constructed and sized corresponding to the first plate 2000 such that the base 3100 can be mounted to the first plate 2000 by latching to thereby reduce the assembly time. It should be understood that the base 3100 can also be mounted to the first plate 2000 by screws or another fastening element (not shown). Specifically, the base 3100 may include a plurality of fifth restricting structures 3150, and the first plate 2000 includes a plurality of sixth restricting structures 2200 corresponding to the fifth restricting structures 3150. The base 3100 can be mounted to the first plate 2000 via the engagement of the fifth restricting structures 3150 with the sixth restricting structures 2200. In the present embodiment, the base 3100 has a second surface 3104 facing the first plate 2000, and a third surface 3106 and a fourth surface 3108 perpendicularly connected to the second surface 3104. Each of the third surface 3106 and the fourth surface 3108 is formed with the fifth restricting structures 3150. In the present embodiment, the fifth restricting structures 3150 may be a plurality of protrusions, and the sixth restricting structures 2200 may form a sliding rail. It should be noted that the fifth restricting structures 3150 may form a sliding rail, and the sixth restricting structures 2200 may be a plurality of protrusions or other suitable structures that can fit with the sliding rail.

The engagement of the fifth restricting structures 3150 with the sixth restricting structures 2200 can restrict the movement of the base 3100 in a second direction D2 and a third direction D3. The first plate 2000 can also include a plurality of seventh restricting structures 2300 formed on two sides of the base 3100, for restricting movement of the base 3100 in a first direction D1. The first direction D1, the second direction D2, and the third direction D3 are perpendicular to each other. In the present embodiment, the seventh restricting structures 2300 may be bumps or protrusions.

In addition, the sliding member 3200 may be made from plastic and includes a pushing portion 3220 for user to push the sliding member 3200. Furthermore, in order to enable the user to clearly identify the locking and unlocking directions, a fifth surface 3204 of the sliding member 3200 away from the resilient element 3300 is provided with a plurality of identification marks 3208. These identification marks 3208 may include an unlocking mark, an opening mark, a directional mark, or any combination thereof. These identification marks 3208 enable the user to clearly know that, when it is desired to open the lock or unlock, the sliding member 3200 should be pushed in the first direction D1 or a direction opposite to the first direction D1.

Referring to FIG. 2 and FIG. 3, assembly of the fixing module 3000 to the plate 2000 is described below. The resilient element 3300 is firstly assembled to the base 3100, with the locking pin 3320 of the resilient element 3300 passing through the opening 3110 of the base 3100. In the present embodiment, the base 3100 may include a latch portion 3101, for example, a hook. The movement of the resilient element 3300 in the first direction D1 can be restricted by the engagement among the latch portion 3101, the first restricting structure 3120, and the second restricting structure 3330.

Afterwards, the sliding member 3200 is slid into the base 3100 from one end of the base 3100 where the third restricting structure 3130 is located. When the sliding member 3200 slides into the base 3100 from the end of the base 3100 where the third restricting structure 3130 is located, the sliding member 3200 first presses the third restricting structure 3130 such that the third restricting structure 3130 produces temporary elastic deformation in a direction opposite to the third direction D3 to allow the sliding member 3200 to successfully slide into the base 3100. After the sliding member 3200 successfully slides into the base 3100, the sliding member 3200 is positioned on the base 3100 by the third restricting structure 3130 thus completing the assembly of the fixing module 3000.

After the sliding member 3200 is assembled to the base 3100, a top wall 3103 and a bottom wall 3105 can restrict movement of the sliding member 3200 in the second direction D2 and the direction opposite to the second direction D2. In addition, the top wall 3103 and the bottom wall 3105 includes a bent portion 3107, 3109, respectively. The bent portion 3107 and the bent portion 3109 can restrict movement of the sliding member 3200 in the third direction D3. More specifically, the sliding member 3200 has a sliding surface 3201 for allowing the sliding member 3200 to be inserted into the base 3100 and positioned between the bent portion 3107, bent portion 3109, restricting structures, first surface 3102, and bottom wall 3105 such that the sliding member 3200 can slide on the first surface 3102 in the first direction D1.

Next, the fixing module 3000 is assembled to the first plate 2000. Specifically, the fifth restricting structure 3150 of the base 3100 and the sixth restricting structure 2200 of the first plate 2000 are first engaged. In the present embodiment, the exemplary protrusion of the fifth restricting structures 3150 slide into the sliding rail formed by the sixth restricting structures 2200, and the seventh restricting structure 2300 of the first plate 2000 is used to restrict the movement of the base 3100 in the first direction D1 and the direction opposite to the first direction D1.

In assembly of the case of the present embodiment, the base 3100, resilient element 3300 and sliding member 3200 are first assembled to form the fixing module 3000, and the fixing module 3000 is then assembled to the first plate 2000. In alternative embodiments, the assembly may be varied such that, for example, the base 3100 is first assembled to the first plate 2000, and the resilient element 3300 and the sliding member 3200 are then in turn assembled to the base 3100.

Figure 4:
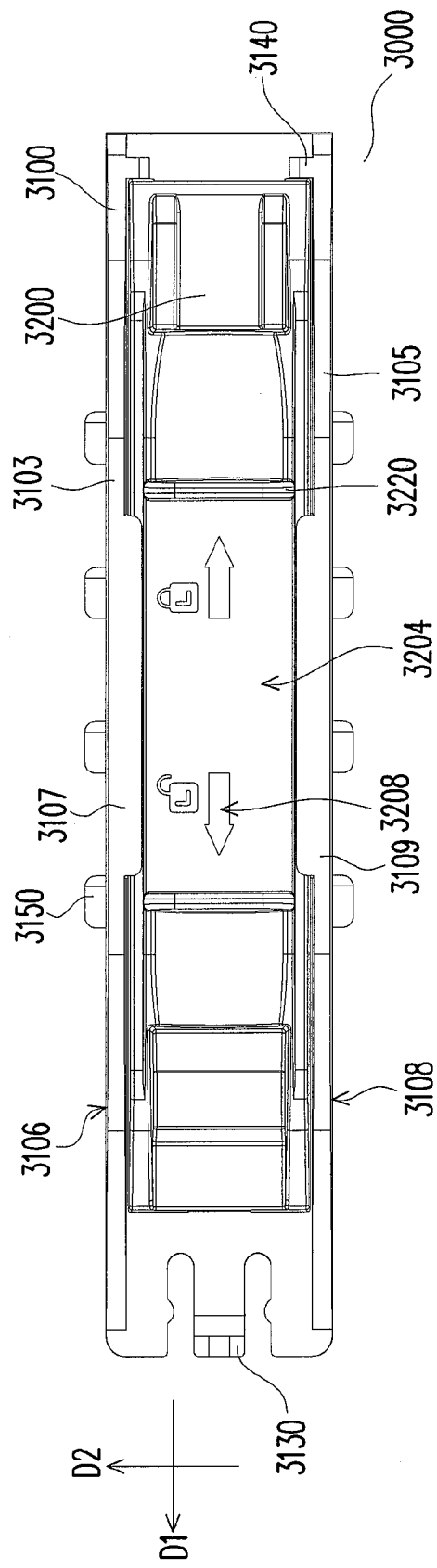
FIG. 4 is a front view of the sliding member of the fixing module of FIG. 1 in a locking position.
Figure 5:
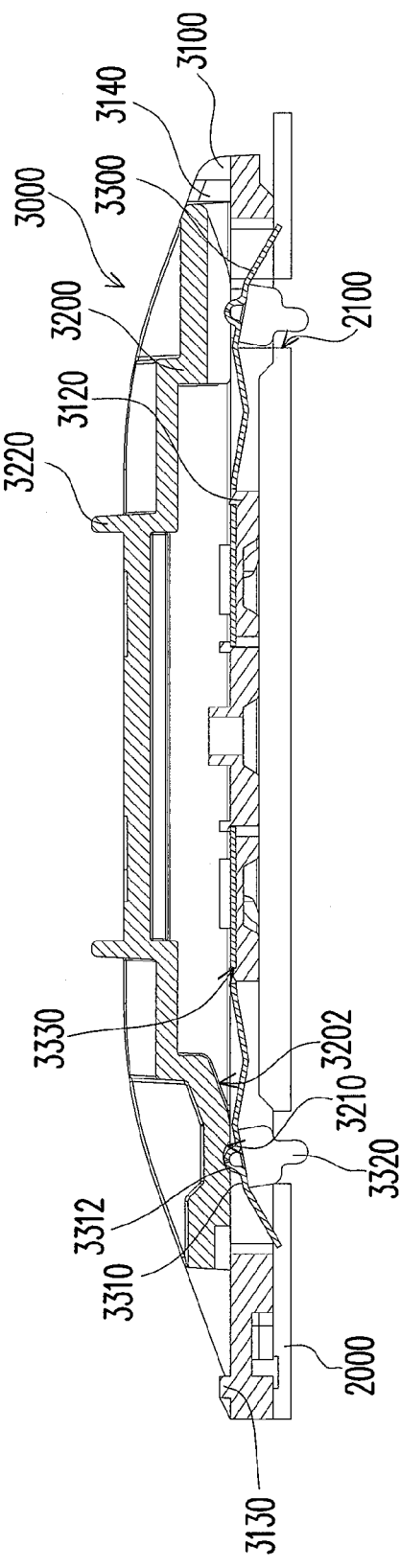
FIG. 5 is a top cross-sectional view of the fixing module and the first plate of FIG. 4.

FIG. 4 is a front view of the sliding member of the fixing module of FIG. 1 in a locking position, and FIG. 5 is a top cross-sectional view of the fixing module and the first plate of FIG. 4. Referring to FIG. 2, FIG. 4 and FIG. 5, when the sliding member 3200 is in the locking position, one end of the sliding member 3200 leans on the fourth restricting structure 3140, and the other end of the sliding member 3200 is positioned relatively away from the third restricting structure 3130. In addition, the sliding member 3200 includes an inclined guiding surface 3202 facing the resilient element 3300. The inclined guiding surface 3202 is used to press the pressing portion 3310 of the resilient element 3300 such that the locking pin 3320 passes through the first mounting hole 2100 of the first plate 2000 and inserts into the second mounting hole 4100 of the electronic device 4000. In the present embodiment, the pressing portion 3310 includes, for example, a bump 3312 protruding toward the sliding member 3200, and the sliding member 3200 may include a cavity 3210 corresponding to the bump 3312. When the sliding member 3200 is in the locking position, the bump 3312 is, for example, engaged in the cavity 3210. The engagement of the bump 3312 in the cavity 3210 can further position the sliding member 3200 in the locking position. After the locking pin 3320 passes through the first mounting hole 2100 of the first plate 2000 and inserts into the second mounting hole 4100 of the electronic device 4000, the electronic device 4000 can be securely mounted to the first plate 2000.

Figure 6:
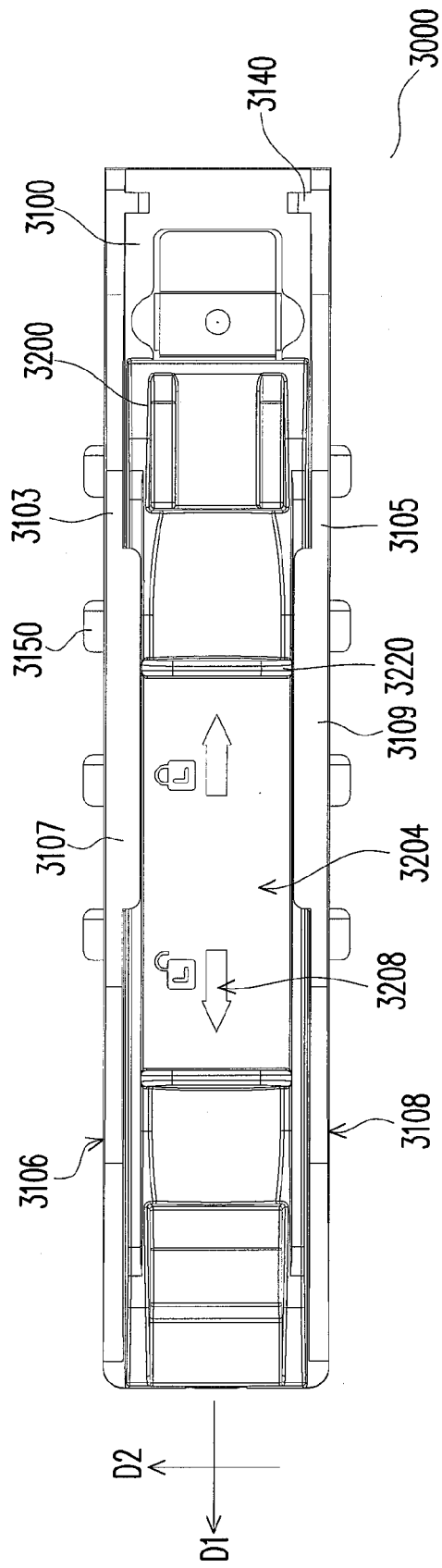
FIG. 6 is a front view of the fixing module of FIG. 1 in an unlocking position.
Figure 7:
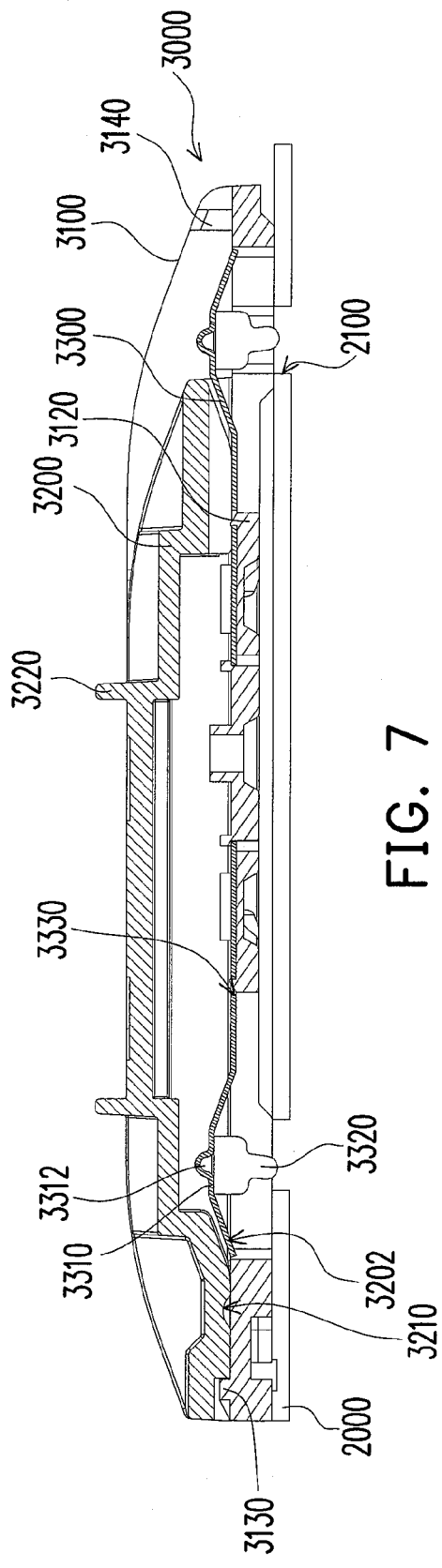
FIG. 7 is a top cross-sectional view of the fixing module and the first plate of FIG. 6.

FIG. 6 is a front view of the fixing module of FIG. 1 in an unlocking position, and FIG. 7 is a top cross-sectional view of the fixing module and the first plate in FIG. 6. Referring to FIG. 2, FIG. 6 and FIG. 7, when it is desired to remove the electronic device 4000, the user may know the unlocking direction from the identification mark 3208 and manipulate to push the pushing portion 3220 of the sliding member 3200 to move the sliding member 3200 to the unlocking position in the first direction D1.

When the sliding member 3200 reaches the unlocking position, the guiding structure 3204 of the sliding member 3200 no longer presses the pressing portion 3310 of the resilient element 3300, such that the resilient element 3300 can return back to its original state under the influence of its own resilient restoring force. In this state, the locking pin 3320 is no longer inserted in the second mounting hole 4100 of the electronic device 4000, and the fixing module 3000 no longer restricts the movement of the electronic device 4000, such that the electronic device 4000 can be removed from the case 1000.

In summary, when the case and its fixing module of the present invention are used, tools are not required for quick removal of the electronic device, thereby reducing the assembly time and labor force.

In addition, during the process of removing and assembling the electronic device, the user does not need to remove screws and therefore does not need to worry about the missing of the screws. Thus, it is rather convenient to use for the user.

Furthermore, during the process of removing and assembling the electronic device, screws are not used and therefore will not be left in the electronic equipment to affect operation of the electronic equipment. Moreover, a harsh sound resulted from rolling of screws in the electronic equipment when the electronic equipment is transmitted is also avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fixing module for fixing an electronic device to a plate, the plate having at least one first mounting hole, the electronic device having at least one second mounting hole corresponding to the first mounting hole, the fixing module comprising:
    a base configured to be mounted to the plate;
    a sliding member movably disposed on the base; and
    at least one resilient element located between the base and the sliding member, the resilient element comprising at least one pressing portion and at least one locking pin located on the pressing portion, wherein when the sliding member is in a locking position, the sliding member presses the pressing portion such that the locking pin passes through the first mounting hole and inserts into the second mounting hole, wherein the base further includes a plurality of fifth restricting structures, the plate further includes a plurality of sixth restricting structures corresponding to the fifth restricting structures, and the fifth restricting structures are configured for engaging with the sixth restricting structures, and the base includes a second surface facing the plate, and a third surface and a fourth surface perpendicularly connected to the second surface, and the third surface and the fourth surface are provided with the fifth restricting structures.

2. The fixing module according to claim 1, wherein the base has at least one opening for exposing the first mounting hole, and the locking pin is configured to pass through the opening.

3. The fixing module according to claim 1, wherein the base includes at least one first restricting structure located on a first surface of the base that faces the resilient element, the resilient element includes at least one second restricting structure corresponding to the first restricting structure, and the first restricting structure is engaged with the second restricting structure.

4. The fixing module according to claim 3, wherein the first restricting structure is a protrusion and the second restricting structure is an opening or a slot.

5. The fixing module according to claim 1, wherein each end of the base includes a third restricting structure and a fourth restricting structure respectively, for restricting movement of the sliding member between the locking position and an unlocking position.

6. The fixing module according to claim 5, wherein the third restricting structure is a hook, and the fourth restricting structure is a protrusion.

7. The fixing module according to claim 1, wherein the fifth restricting structures are protrusions and the sixth restricting structures are sliding rails.

8. The fixing module according to claim 1, wherein the pressing portion of the resilient element further includes a bump, the sliding member includes a cavity corresponding to the bump, and the bump is engaged in the cavity when the sliding member is in the locking position.

9. The fixing module according to claim 1, wherein the sliding member includes a pushing portion for user to manipulate.

10. The fixing module according to claim 1, wherein the sliding member includes an inclined guiding surface configured to press the resilient element.

11. The fixing module according to claim 1, wherein a fifth surface of the sliding member away from the resilient element is provided with a plurality of identification marks for indicating movement direction of the sliding member.

12. A fixing module for fixing an electronic device to a plate, the plate having at least one first mounting hole, the electronic device having at least one second mounting hole corresponding to the first mounting hole, the fixing module comprising:
    a base configured to be mounted to the plate;
    a sliding member movably disposed on the base; and
    at least one resilient element located between the base and the sliding member, the resilient element comprising at least one pressing portion and at least one locking pin located on the pressing portion, wherein when the sliding member is in a locking position, the sliding member presses the pressing portion such that the locking pin passes through the first mounting hole and inserts into the second mounting hole, wherein the pressing portion of the resilient element further includes a bump, the sliding member includes a cavity corresponding to the bump, and the bump is engaged in the cavity when the sliding member is in the locking position.

13. A fixing module for fixing an electronic device to a plate, the plate having at least one first mounting hole, the electronic device having at least one second mounting hole corresponding to the first mounting hole, the fixing module comprising:
    a base configured to be mounted to the plate;
    a sliding member movably disposed on the base; and
    at least one resilient element located between the base and the sliding member, the resilient element comprising at least one pressing portion and at least one locking pin located on the pressing portion, wherein when the sliding member is in a locking position, the sliding member presses the pressing portion such that the locking pin passes through the first mounting hole and inserts into the second mounting hole, wherein the sliding member includes an inclined guiding surface configured to press the resilient element.

* * * * *